United States Patent [19]

Fromson et al.

[11] 4,277,555

[45] Jul. 7, 1981

[54] ALUMINUM LITHOGRAPHIC PLATE WITH VISIBLE IMAGE AND PROCESS

[75] Inventors: Howard A. Fromson, 15 Rogues Ridge Rd., Weston, Conn. 06880; Robert F. Gracia, Scituate, Mass.

[73] Assignee: Howard A. Fromson, Weston, Conn.

[21] Appl. No.: 85,145

[22] Filed: Oct. 12, 1979

[51] Int. Cl.[3] .......................... G03C 1/94; G03F 7/02

[52] U.S. Cl. .................................... 430/278; 148/6.1; 427/259; 427/282; 427/287; 427/327; 428/577; 428/687; 428/450; 430/293; 430/294; 430/302; 430/329; 430/309; 430/358; 430/365; 430/374; 430/526

[58] Field of Search ............... 430/293, 294, 302, 309, 430/329, 358, 365, 374, 526, 278; 427/282, 287, 327, 259; 428/687, 539, 577, 650, 654; 148/6.1; 8/3

[56] References Cited

U.S. PATENT DOCUMENTS

| | | | |
|---|---|---|---|
| 2,614,912 | 10/1952 | Rice | 427/280 |
| 3,077,425 | 2/1963 | Fromson | 8/3 |
| 3,079,309 | 2/1963 | Wainer | 204/35 N |
| 3,083,149 | 3/1963 | Cranston | 8/3 |
| 3,131,085 | 4/1964 | Wells et al. | 8/3 X |
| 3,172,786 | 3/1965 | Kirby et al. | 8/3 |
| 3,181,461 | 5/1965 | Fromson | 430/274 X |
| 3,218,243 | 11/1965 | Michelson | 148/6.1 |
| 3,264,142 | 8/1966 | Wainer | 427/259 X |
| 3,290,232 | 12/1966 | Dunning | 148/6.1 |
| 3,291,651 | 12/1966 | Brassel | 148/6.1 |
| 3,440,111 | 4/1969 | Dale | 148/6.1 |
| 3,527,604 | 9/1970 | Endermann et al. | 430/293 X |
| 3,833,374 | 9/1974 | Patrick | 430/293 |
| 3,841,891 | 10/1974 | Pallant | 430/293 |

*Primary Examiner*—Edward C. Kimlin
*Attorney, Agent, or Firm*—Sprung, Felfe, Horn, Lynch & Kramer

[57] ABSTRACT

Aluminum substrate suitable for making lithographic plates which has been treated to render the surface hydrophilic and negatively charged and thereafter ionically colored with a cationic dye.

5 Claims, No Drawings

ALUMINUM LITHOGRAPHIC PLATE WITH VISIBLE IMAGE AND PROCESS

BACKGROUND

This invention relates to lithographic printing plates with visible images and to a process for making such plates.

Lithographic printing techniques, using, for example, anodized and silicated aluminum base plates such as described in Fromson U.S. Pat. No. 3,181,461 issued May 4, 1965, have come into widespread use in the printing industry and especially in offset printing and direct lithographic printing by newspapers using converted letterpress printing presses.

A conventional negative working lithographic printing plate of this type has a coating of a light sensitive substance that is adherent to the aluminum base sheet for exposure. If the light sensitive coating is applied to the base sheet by the manufacturer, the sheet is referred to as a "presensitized plate". If the light sensitive substance is applied to the base by the lithographer or trade plate maker, the plate is referred to as a "wipe-on plate". Depending on the nature of the photosensitive coating employed, a coated plate may be utilized to reproduce directly the image to which it is exposed, in which case it is termed a positive-acting plate, or to produce an image complementary to the one to which it is exposed, in which case it is termed a negative acting plate. In either case, the image area of the developed plate is oleophilic and the non-image area is hydrophilic.

In the case of negative working plate, the surface is coated with an aqueous solution of a conventional diazo resin. The plate is dried and exposed through a negative. The exposed image areas become water insoluble and the unexposed non-image areas remain water soluble. The plate is conventionally developed with a lithographic lacquer which consists of a two-phase system, one phase containing an oleophilic resin in a solvent and the other phase a hydrophilic gum. Upon application, the oleophilic resin adheres to and makes visible the exposed insoluble areas, while the hydrophilic phase dissolves away the unexposed soluble non-image or background areas. In this way, the visible image is made oleophilic or ink receptive and the background is made hydrophilic or ink repellent.

In our companion application, Ser. No. 064,322 filed Aug. 6, 1979, we describe the simultaneous chemical amplification of diazo sensitized plates using an anionic material in an ionizing reaction medium. This provides a water developable plate and eliminates the use of conventional solvent/resin containing lacquers. In the present invention we provide a lithographic substrate and plate that produces a visible image upon development without relying on a component of the developer to become adhered to the image area.

SUMMARY

The present invention provides an aluminum lithographic substrate which has been treated to render the surface hydrophilic and negatively charged and thereafter ionically colored with a cationic dye.

The invention further provides an aluminum printing plate the surface of which has been treated to render it hydrophilic and negatively charged and then coated simultaneously or sequentially with a light sensitive, cationic, positively charged diazonium material and a cationic dye. The coated surface is capable of having its solubility altered upon exposure to actinic light and thereafter developed to produce a visible, dyed image and a hydrophilic background free of the diazonium material and dye.

This invention further provides a dyed anodized aluminum article. Normally, anodized aluminum is dyed using anionic and non-ionic dyes. Up to now, cationic dyes could not be used because the surface of anodized aluminum is either neutral or acid. It has now been discovered that anodized aluminum can be effectively dyed or colored with a cationic dye by first treating the anodized aluminum to render the surface thereof anionic. This makes it now possible to color code products and provide a visible image on a lithographic plate without interfering with the developing process or altering the lithographic properties of a plate.

It has been proposed to use an anionic dye on an anodized aluminum substrate for lithographic purposes (U.S. Pat. No. 3,280,734). However, this was not commercially successful because the dye remained in the background after developing which caused scumming and toning during printing.

The present invention employs a cationic dye for anodized aluminum which is ionically removed from the background during development of the plate, while the color remains permanently in the image area after exposure and development, without undergoing any change during either process. This results in a visible image, with the substrate ionically colored in the image area, and a suitable lithographic background (hydrophylic and oleophobic) which has been ionically cleared of the cationic dye.

DESCRIPTION

Cationic dyes used in the invention can be applied to the negatively charged substrate or incorporated in the light sensitive material to provide a visible image on the plate. Suitable dyes include basic cationic dyes such as Victoria Green, Rhodamine B, Rhodamine 5GLD, crystal violet, extra pure APN, Paper Blue R and the like.

Cationic light sensitive materials that can be used in the invention are diazonium materials having reactive sites capable of being chemically altered by light or chemically reacted with an anionic material. For example, 4-diazo diphenylamine condensed with a carbonyl compound such as formaldehyde has the needed multiplicity of reactive sites each having the desired dual functionality. Preferred are water soluble diazonium compounds but water insoluble compounds can also be used. Suitable diazonium compounds are described in U.S. Pat. No. 3,849,392 to Steppan and U.S. Pat. No. 3,311,065 to Steppan.

Suitable anionic materials are water soluble and include the alkali metal salts of alkylaryl sulfonates having 1 to 20 carbon atoms in the alkyl portion and 6 to 14 carbon atoms in the aryl portion, alkali metal salts of alkyl sulfonates having 12 to 20 carbon atoms and ammonium and alkali metal salts of sulfated higher fatty alcohols having 10 to 20 carbon atoms. Anionic materials are dissolved in an ionizing reaction medium (usually water) and the concentration of the anionic material is sufficient to couple with the light sensitive material and to dissolve the coupled reaction product from the unexposed areas.

Specific examples of anionic surfactants are given herein together with a test to determine suitability.

The aluminum substrate is treated to render the surface hydrophilic and anionically charged. The preferred lithographic substrate is anodized aluminum which may be pretreated before anodizing to roughen or grain the surface, for example using mechanical, chemical or electrochemical techniques as are well known in the art and it may be post-treated after anodizing. It is preferred to impart hydrophilicity and a negative charge by silicating as described in Fromson U.S. Pat. No. 3,181,461.

After treatment with the anionic material, the image can be reinforced with an oleophilic UV curable material which can be coated on and then cured. This is described in copending application Ser. No. 972,567, filed Dec. 22, 1978, which is incorporated herein by way of reference.

Suitable UV curable materials are commercially available from a number of sources in the form of UV curable inks, coatings, oligomers and monomers. Such commercially available materials can be obtained from the following companies: Inmont Corporation, Sinclair & Valentine, Celanese Chemical Company, 3-M Company, Desoto Chemical Company, Paulimer Industries, Shell Chemical, Mobile Chemical, W. R. Grace, Design Coat Company, and Ware Chemical Corporation. UV curable materials including monomers and oligomers are described in the following patents:

U.S. Pat. No. 3,297,745—1967
U.S. Pat. No. 3,380,381—1968
U.S. Pat. No. 3,673,140—1972
U.S. Pat. No. 3,770,643—1972
U.S. Pat. No. 3,712,871—1973
U.S. Pat. No. 3,804,736—1974

There are also materials that will cure upon exposure to other sources of radiation, for example an electron beam. These curable materials can be used in special applications in place of the UV material and are commercially available. Electron beam curable compositions are described in U.S. Pat. Nos. 3,586,526–3,586,530, 1971.

Producing a visible image by chemical amplification after exposure to actinic radiation makes it possible to substantially reduce exposure times normally required with diazonium compounds. This can be expressed empirically as simply the amount of actinic light necessary to produce an image capable of running on a lithographic press. Chemical amplification makes it possible to reduce the amount of light needed to attain this by a factor of from 2 to 10 or more. This means that a diazo sensitized plate that normally required 1 to 2 minutes to image can be imaged in a matter of seconds. The amount of diazo on the plate can also be reduced.

The amount of light necessary to produce an image capable of running on a lithographic press can also be expressed in terms of millijoules per square centimeter. The amount of actinic light can be from less than about 100 to as little as 5 millijoules/$cm^2$ at UV wave lengths of 300–400 namometers. This means that plates can be exposed with low power lasers such as are marketed by EOCOM Inc. and developed to produce a visible image.

After treatment with the preferred anionic material, the developed amplified image can be blanket exposed to actinic light to photo react any remaining light sensitive sites in the image area. This includes coupled diazonium and anionic materials which remain light sensitive after coupling.

A test to determine whether a particular anionic material is suitable is as follows:

A 5% aqueous solution of the anionic material is prepared. An aluminum lithographic plate grained, anodized, and silicated is coated with a 1% solution of a light sensitive diazo condensation product (such as Fairmont's Chemical Diazo #4). The coated plate is exposed to a Stouffer Graphic Arts Guide for a relatively short period of time—5 to 10 seconds. The exposed plate is immersed in the 5% solution of anionic material for 10 seconds. The plate is then rinsed and lacquered with a standard lithographic lacquer (such as Fairmont's Black Lacquer). Another plate, identically prepared and exposed, is treated with the Black Lacquer only. This is the control. The two plates are compared. If the anionic material is effective, the post-treated plate will show significant difference in light sensitivity versus the control.

The effectiveness of certain anionic materials can be enhanced by either a pH adjustment and/or the use of a co-solvent. The optimum pH for most anionic materials useful in this invention is in the range of pH 2–10. Suitable co-solvents are alcohols such as ethanol, butanol and the like and glycols.

Many different salts of anionic materials are suitable; these include sodium, lithium, ammonium, or triethanol amine salts and the like. Examples of suitable anionic surfactants (and their commercial sources) are as follows:

1. Sodium lauryl sulfate (Proctor & Gamble, Equex S. Equex SP; Alcolac, Inc. Sipex SB).
2. Ammonium lauryl sulfate (Alcolac, Inc., Sipon L-22).
3. Sodium lauryl ether sulfate (Alcolac, Inc., Sipon ES).
4. Sodium dodecyl benzene sulfonate (Alcolac, Inc. Siponate DS-XO).
5. Ammonium lauryl ether sulfonate (Alcolac, Inc. Sipon EA).
6. Triethanolamine lauryl sulfate (Alcolac, Inc. Sipon LT-6).
7. Sodium alkyl sulfate (Alcolac, Inc., Sipex OLS).
8. Sodium stearate (Emery Inds.).
9. Sodium palmitate (Emery Inds.).
10. Sodium oleate (Matlerson, Coleman & Bell).
11. Dioctyl sodium sulfosuccinate (Cyanamid, Aerosol OT).
12. Tetrasodium N-Cl, 2 dicarboxyethyl 1) - N - octadecyl sulfosuccinate (Cyanamid, Aerosol 22 ).
13. Sodium Xylene sulfonate (Witco Chemical, Ultra SXS).
14. Sodium toluene sulfonate (Witco Chemical, Ultra STS).
15. Sodium cumene sulfonate (Witco Chemical, Ultra SCS hydrotrope).
16. Sodium dihexyl sulfosuccinate (Cyanamide Aerosol AY-65).
17. Sodium diamyl sulfosuccinate (Cyanamide Aerosol AY-65).
18. Anionic phosphate surfactant (Rohm & Haas Co., Triton QS-30).
19. Sodium alkylaryl polyether sulfate (Rohm & Haas Co., Triton W-30 conc.).
20. Phosphate surfactant, potassium salt (Rohm & Haas Co., Triton H-66).

21. Sodium alkylaryl polyether sulfonate (Rohm & Haas Co., Triton X-200).

Sodium lauryl sulfate is preferred because of its availability and cost.

EXAMPLE 1 (control)

A 1% solution of the formaldehyde condensation product of a diphenylamine-4-diazonium zinc chloride double salt (Fairmont Diazo Resin #4) is prepared in water. The solution is placed in a two roll coating machine. A brushed grained, anodized and silicated plate, 10×16×0.12 (Ano-Coil Delta Plate) is coated face down through the machine. The coated plate is dried and placed in a Nu Arc Plate Maker exposure unit, 24 inches from the source (4 kw lamp). A Stouffer Graphic Arts Step scale is step exposed on the plate for the following times: 1 second, 5 seconds, 10 seconds, 15 seconds, 30 seconds, and 60 seconds. The exposed plate is then developed with Fairmont's black lacquer for wipe-on plates. After development, rinsing, and drying the solid step exposure level is read for each exposure time: 1 second—no image, 5 seconds—no image, 10 seconds—a ghost image, 15 seconds—a solid 1, 30 seconds—a solid 3, and 60 seconds—a solid 5—normal for this type of plate system.

EXAMPLE 2

A brush grained, anodized silicated aluminum plate (Alloy 1100) is immersed in a dye bath of a 1% solution of a basic (cationic) dye such as DuPont's Victoria Green Liquid, Rhodamine B Liquid, Rhodamine 5 GLD, crystal violet extra pure APN or Paper Blue R Liquid. The dyed plate is then coated as in Example 1. The coated plate is then exposed in a 4 kw Nu Arc flip top exposure unit for 5 seconds to a newspaper page negative. The exposed, dyed plate is immersed in a 5% solution of sodium lauryl sulfate. Immediately upon removal from the bath a strong visible image is seen on the plate.

EXAMPLE 3

A brushed grained, silicated, and anodized plate (Ano-Coil's Delta Plate) is coated with a 1% diazo coating (Fairmount Resin #4) containing ½% Victoria Green Liquid dye (DuPont). The plate is dryed and exposed for 5 seconds on a Nu Arc as in Example 7. The plate is developed in a 5% solution of ammonium lauryl sulfate. Upon application of the developer with a sponge, a visible image becomes immediately apparent.

EXAMPLE 4

A lithographic plate (Ano-Coil's Delta plate) is dyed in a 1% solution of Victoria Green Liquid. The plate is coated with a 1% solution of Fairmont diazo resin #4 exposed to a newspaper negative for 10 seconds and immersed in a 5% solution of sodium lauryl sulfate. Immediately an image becomes visible. The plate is rinsed in tap water and dryed. The plate is placed on a Goss Metro Press and 50,000 good images are obtained.

EXAMPLE 5

A plate is prepared as in Example 2 but after development it is rubbed with a UV curable emulsion (Example 6) rinsed, dryed, and re-exposed through a PPG UV processor at 25 ft./minute. The plate is placed on a Goss Metro newspaper press and 250,000 impressions are obtained.

EXAMPLE 6

A brush grained, anodized, silicated, aluminum plate is coated with a 1% solution of water soluble polyfunctional diazo resin (Fairmont's diazo resin #4) containing ½% Victoria Green liquid dye as in Example 2 and dryed. The sensitized plate is then placed in an Eocom Laserite Platemaker and scanned with an ion argon laser. A scanning time of 1 minute is necessary to scan a plate approximately 23×14. The approximate laser power at the plate surface is 8 mj/cm². After scanning, the plate is developed with a 5% solution of sodium lauryl sulfate as in Example 2 to produce a strong quality visible image.

EXAMPLE 7

A plate was coated, laser exposed and developed as in Example 5 using 10 mj/cm² laser power. This time after development, the plate was rubbed with the following UV curable emulsion:

(A)

30 grms Inmont UV Blue Ink
12.5 cc Span 80 (I.C.I.)
120 mls Cellosolve Acetate (B)

250 mils 8° Be Gum Arabic
12.5 grms Pluronic F38 (BASF)

Mix by adding (B) to (A) while stirring. The emulsion can be applied with sponge, cloth, or brush. After treatment with the UV emulsion the plate is re-exposed in a high intensity UV processor such as a PPG Industries, Model PC2502A at 25 ft/minute. A tough and abrasion resistant visible image is produced.

EXAMPLE 8

A plate as described in Example 5 was dyed with a cationic water soluble dye, 1% Victoria Green (DuPont). The plate was coated with a 1% solution of diazo resin and dryed. This plate was laser exposed as in Example 5 with laser power of 4 mj/cm², After exposure to the laser, the plate is developed by hand with sodium lauryl sulfate (5% solution). The thus treated plate is then lacquered with a black lacquer from Western Litho Company (Jet Black). A dense black image results.

EXAMPLE 9

An aluminum sheet (Alloy 1100) is degreased using a commercially formulated degreasing compound such as Aldet (Wyandotte Chemical Company). The plate is degreased at 180° to 185° F. for 30 seconds at a concentration of 6 to 8 ounces/gallon. Next the plate is rinsed and anodized for 50 AMP - minutes using sulfuric acid (280 grams/liter at 90° F.), rinsed and silicated with sodium silicate (3%), rinsed and finally dyed with a cationic dye such as Rodamine 5 GLD (Dupont) at 4 grams/liter. The dyed sheet is rinsed in tap water for several minutes and then dryed. A brightly colored aluminum sheet results. The dye can be easily discharged using an anionic surfactant (5%) such as sodium lauryl sulfate.

EXAMPLE 10

An aluminum sheet is degreased, rinsed, and silicated as in Example 9 but not anodized. The anionically charged surface is then dyed with a cationic dye such as Dupont's Paper Blue R Liquid 5 cc/liter at room temperature for one minute. A blue sheet results. The dye is resistant to rinse water but is easily discharged by immersion in a 5% solution of sodium lauryl sulfate.

EXAMPLE 11

A sheet of aluminum is degreased and anodized as in Example 9 but not silicated and a second sheet is degreased, anodized, and silicated as in Example 9. Both sheets are then immersed for 30 seconds in a 1% solution of copper BF, an anionic dye, (Sandoz) at 160° F. and a pH of 5.5. The first sheet which is not silicated and therefore cationically charged takes the dye readily. The second sheet which is silicated will not dye. The first sheet is immersed in 5% anionic surfactant to see if the dye can be removed. It will not discharge with this treatment.

We claim:

1. Lithographic substrate comprising an aluminum plate which has been treated with an alkali metal silicate to render the surface hydrophilic and negatively charged and thereafter ionically colored with a cationic dye.

2. Substrate of claim 1 wherein the plate has a porous anodic oxide surface thereon which has been treated with the said alkali metal silicate to render it hydrophilic and negatively charged.

3. Substrate of claim 1 coated with a cationic, positively charged light sensitive material.

4. Anodized aluminum article the surface of which has been treated with an alkali metal silicate to render it anionic and negatively charged and thereafter colored with a cationic dye.

5. Process for coloring anodized aluminum which comprises treating anodized aluminum with an alkali metal silicate to render the surface thereof anionic and negatively charged and thereafter coloring said surface with a cationic dye.

* * * * *